United States Patent

[11] 3,620,837

[72] Inventors Jerry Leff
Poughkeepsie, N.Y.;
Arthur A. Roberts, Danbury, Conn.
[21] Appl. No. 759,898
[22] Filed Sept. 16, 1968
[45] Patented Nov. 16, 1971
[73] Assignee International Business Machines Corporation
Armonk, N.Y.

[54] RELIABILITY OF ALUMINUM AND ALUMINUM ALLOY LANDS
4 Claims, 2 Drawing Figs.

[52] U.S. Cl. .... 117/217, 29/577, 29/589, 117/107, 117/227
[51] Int. Cl. .... B44d 1/18
[50] Field of Search .... 117/107, 217, 227, 201, 212; 29/577, 589, 576, 578; 317/234 (5)

[56] References Cited

UNITED STATES PATENTS

| | | | |
|---|---|---|---|
| 3,158,504 | 11/1964 | Anderson | 117/227 X |
| 3,382,568 | 5/1968 | Kuiper | 117/107 UX |
| 3,300,339 | 1/1967 | Perri et al. | 117/212 X |
| 3,368,919 | 2/1968 | Casale et al. | 117/212 X |
| 3,455,020 | 7/1969 | Dawson et al. | 29/589 X |
| 3,484,932 | 12/1969 | Cook, Jr. | 29/577 |
| 3,498,818 | 3/1970 | Bahm et al. | 117/107 X |
| 3,518,506 | 6/1970 | Gates | 29/589 X |

*Primary Examiner*—Alfred L. Leavitt
*Assistant Examiner*—C. K. Weiffenbach
*Attorneys*—Robert S. Dunham, P. E. Henninger, Lester W. Clark, Thomas F. Moran, Gerald W. Griffin, Howard J. Churchill, R. Bradlee Boal, Christopher C. Dunham and John F. Ohlandt, Jr.

ABSTRACT: Improved reliability of aluminum and aluminum alloy lands on semiconductor integrated circuits is obtained by vapor depositing aluminum or an aluminum alloy onto a semiconductor substrate which is at a temperature between 320° and 570° C. The total thickness of the deposited aluminum or aluminum alloy is between 5,000 and 25,000 A.

INVENTORS
JERRY LEFF
ARTHUR A. ROBERTS
BY
John F. Ohlandt Jr.
ATTORNEY

RELIABILITY OF ALUMINUM AND ALUMINUM ALLOY LANDS

BACKGROUND, OBJECTS & SUMMARY OF THE INVENTION

This invention relates generally to the fabrication of aluminum or aluminum alloy patterns upon insulating or semiconductor substrates, and more particularly to the manufacture of integrated circuits. The invention is especially concerned with an improvement in the reliability obtainable for the lands or conductors that are provided for interconnecting components or the like in the context of integrated circuit fabrication.

For an appreciation of the difficulties that the present invention is calculated to overcome, some background information is considered necessary with respect to the basic aspects of integrated circuit manufacture.

The term "integrated circuits" encompasses a variety of techniques and forms in the field of microminiaturization or microcircuitry. One form that has received the most attention in recent years and which has great expectations for the future is the so-called monolithic integrated circuit. According to the monolithic technique, complete circuits are formed on an integral piece of semiconductor material. In other words, in the monolithic form, all or substantially all of the elements that are involved in the makeup of a circuit are formed in or on the semiconductor wafer or monolith. Generally, the elements or components of the circuit are embedded within the wafer by utilizing the diffusion technology, which, as is well known, is exploited to produce varying depths of penetration of impurities within the monolith to create the desired embedded regions defining elements or components. It is also known, of course, to create the components by thin film techniques. Interconnection of the several elements or components within a circuit is achieved by forming conductors on the upper surface of the monolith.

Integrated circuit design is very much concerned with achieving its objectives with a minimum number of processing steps and with the most reliable kind of processing. As a consequence, design tolerances can be relaxed on individual devices and a circuit function can be realized through the medium of integrated circuit design with a greater number of devices. Nevertheless, despite the greater number of devices that might be involved, the yield that would be obtained would be much higher and, therefore, the cost per circuit function would be significantly lowered.

The possibilities of improved yield stem from the aforenoted improvements in technology, but the extent to which the benefits of higher yield are exploited depends on the reliability that can be obtained. In other words, no matter how high the yield that is immediately practicable, the ultimate test is whether the integrated circuits will perform satisfactorily and will not fail when placed in operation over an extremely long period.

The technique of the present invention has arisen in response to a discovered lack in the reliability of the lands that are formed to interconnect the elements or components in the production of integrated circuits. The term "lands" is used generically to refer to the conductors that make actual contact with embedded devices in a monolith, as well as conductors that merely extend along the surface of the monolith and interconnect terminals or the like.

What has been discovered is that aluminum or aluminum alloy lands serving as the aforenoted conductors can become discontinuous under conditions of direct current. Thus, in operation, it turns out that the integrated circuits will fail in many instances at some point in their use in a computer or the like with disastrous results. The discontinuities stem from the fact that an aluminum mass will move in the direction of electron flow and this can occur at room temperature. Such discontinuities or "opens" happen before the aluminum itself disappears. This occurs because there is, in addition to the mass transport of the aluminum, a buildup of crystallographic vacancies. The net effect of all this is that, under conditions of increased temperature and/or increased current density, the phenomenon of "wearout" eventuates. In other words, opening up of the lands is accelerated.

It is, therefore, a major object of the present invention to overcome this serious problem due to discontinuities in the patterns or lands that are formed on a substrate. The present invention provides a technique that will prolong the time to eventual "wearout" of the aluminum lands and thereby greatly reduce the number of failures that would clearly result for these aluminum or aluminum alloy lands.

Briefly described, this technique resides in the steps of depositing the total thickness required for a layer of aluminum on the surface of the substrate so as to define the necessary lands which could serve as conductors in an integrated circuit, the deposition being effected in a vacuum at a substrate temperature of approximately 320°–570° C. evaporating aluminum at a suitable temperature. The technique of the present invention differs from the conventional technique that has been used for aluminum deposition in a vacuum for the above-indicated purpose. In certain known processing, the substrates or wafers were heated to a much lower temperature, of the order of 200° C.

Although the conventional technique was able to produce a finer grained structure for the lands, the instant technique's advantage of greater reliability more than offsets any drawback due to the lack of fine grained metal film.

The foregoing and other objects, features and advantages of the invention will be apparent from the following more particular description of preferred embodiments of the invention as illustrated in the accompanying drawings.

DESCRIPTION OF PREFERRED EMBODIMENT

Figure 1:
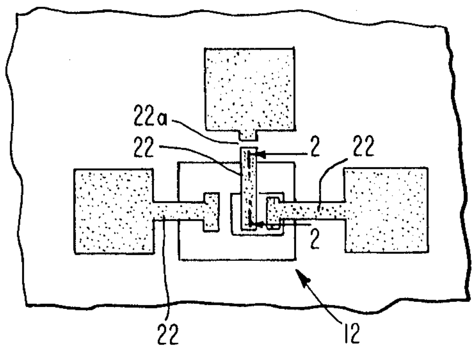
FIG. 1 is a top plan view of a section of a semiconductor substrate in which a typical device has been formed and illustrating a metallization pattern of lands on the top surface of the substrate.
Figure 2:
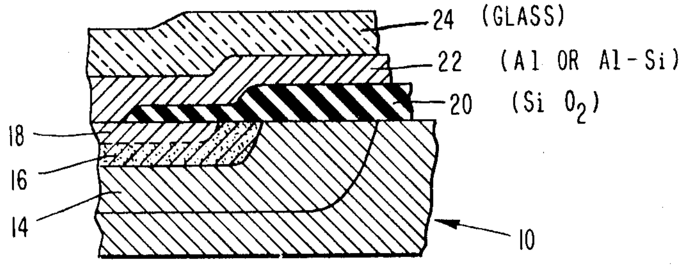
FIG. 2 is a sectional view taken on the line 2—2 of FIG. 1.

The problem that the present invention is successful in overcoming can be appreciated by reference to the figures. The problem is illustrated by a semiconductor substrate such as the substrate 10, typically composed of silicon, at whose top surface lands 22 are disposed over an oxide coating 20. The solution that the present invention affords is useful whether the lands are constituted of pure aluminum or are constituted of an aluminum-silicon alloy.

For the sake of simplicity, a very specific device site is illustrated at which a transistor 12 has been formed. However, on a typical semiconductor substrate the land pattern is actually much more complicated in its configuration. Also, the problem is not limited to the exact site illustrated; that is, it is not limited only to a situation where the land makes physical contact at some point with the semiconductor substrate.

As will be understood, the formation of the transistor device is accomplished by processes which are now so well known in the art that a detailed description is unnecessary. However, it should be noted, in brief, that conventional photo lithography techniques are applied to the insulative coated surface to create the desired masking patterns for producing the typical transistor device 12. In the case of silicon, which is the most common semiconductor for these purposes, a genetic oxide is formed at the surface, that is, $SiO_2$. A sequence of appropriate diffusion steps is performed for creating the required regions embedded within the substrate. Thus, selective diffusions through openings in an oxide coating are carried out to produce the regions 14, 16 and 18. Following formation of the device regions, the required metallization for contacting and interconnecting such devices, as well as other elements, is achieved by similar photolithography techniques.

A conventional practice in producing the metallization comprises coating with aluminum, or an aluminum-silicon alloy, the entire upper surface of a silicon substrate, which has previously been coated with a selectively etched insulative film. Since the insulative film has been selectively etched away, that is, needed openings have been made therein which extend down to the surface of the substrate, the aluminum so deposited is able to make contact at the appropriate places to the embedded regions. This aluminum coating is preferably formed to have a thickness of from 5,000 to 25,000 A. Greater thicknesses are usable and only limited by their etchability. Thereafter, the aluminum is selectively removed by further application of photolithography techniques, involving a resist layer, so as to leave only the desired land pattern, as is typified in FIG. 1, by the showing of the lands 22. The width of the typical land varies from about 0.3 mils to 1.5 mils. In following the above-described conventional process for obtaining the land pattern, a temperature of approximately 200° C. is employed for depositing the aluminum coating.

After the aluminum land pattern 22 has been defined, the entire substrate surface is passivated with a glass film 24. This step is a conventional one, the glass film being applied as a fine frit which is fired at high temperature to form a continuous, overlying protective film.

Insofar as the objective of obtaining good yield is concerned, the previously known process as described above is perfectly satisfactory. However, as has already been brought out, the essential problem resides in the fact that reliability is not assured in the actual operating environment for the extremely narrow lands that have been fabricated. Due to the operating conditions, early failures occur for the lands due to the phenomenon of wearout that is encountered. This wearout occurs unpredictably and an example of such an occurrence is indicated in FIG. 1 at a site **22*a*** adjacent to a transistor device. Wherever it occurs, it has disastrous consequences for the operation of the circuits.

In accordance with the technique of the present invention the semiconductor substrates are heated to an average temperature in the range between approximately 300° and 500° C., the most preferred temperature being approximately 300° C. When reference is made to "average" temperature this refers to the temperature of a shielded wafer, which is a "control" wafer; that is, its temperature is controlled by means of a thermocouple mounted to the front side of the wafer in the normal substrate position. The thermocouple is shielded from the source by a protective plate and during the entire evaporation procedure, the temperature of the shielded thermocontrolled couple is maintained at the predetermined value. Since the exposed or "product" wafers reach a temperature 70° higher than the control wafers it should be borne in mind that when substrate temperature is being referred to, this is, in general, about 70° higher than the temperature of the control wafer, or "average" temperature.

The substrates are disposed within a suitable vacuum evaporation chamber, as is well known in the art, and a quantity of pure aluminum or aluminum alloy is caused to evaporate by application of a temperature of approximately 1,400°–1,500° C. The particles of aluminum, or aluminum alloy, evaporated from the source are deposited over the entire surface of the prearranged substrates, on which the requisite insulative coating has already been formed.

In order to provide a better understanding of the present invention and a greater appreciation of the results that are obtainable by virtue of its practice, the results of tests that were conducted are presented herewith. Two differently designed wafers were subjected to a series of runs.

In the case of the first design, the procedure was to evaporate 10,000 to 11,000 A. of an aluminum-silicon alloy onto the wafers, using a standard low production evaporator. The seven runs were made with a range of temperatures from 66 to 500° C. and the following resistivities were obtained:

| Average Temperature | Median Resistivity |
|---|---|
| 66° C. | $3.78\times10^{'7E'6}$ Ω/cm. |
| 158 | 3.28 |
| 195 | 3.02 |
| 228 | 2.96 |
| 310 | 2.80 |
| 405 | 2.85 |
| 500 | 2.80 |

The temperatures given above were maintained during the entire evaporation cycle in each instance. The pressures used were less than $1.5\times10^{'7E'5}$ torr during the evaporation for all runs.

It was found that there was an increase in apparent grain size with increasing temperature. Also, it was found that the groups of wafers in those runs where the average temperatures were 405° and 500° C. could not be satisfactorily sub-etched due to the coarseness of the film structure.

Another series of five runs were made, but in this instance wafers of a second design were involved. Again, 10,000–11,000 A. of aluminum silicon alloy were evaporated. The average temperatures and the resistivity resulting from each of the runs is given as follows:

| Average Temperature | Median Resistivity |
|---|---|
| 60° C. | $3.86\times10^{'7E'6}$ Ω/cm. |
| 175 | 3.12 |
| 225 | 2.86 |
| 260 | 3.12 |
| 320 | 3.00 |

Following the evaporation results described above, forward bias stress tests were performed on wafers from both the first design group and the second design group. These stress tests were performed at a temperature of 150° C. and with current values of 85 ma. The following table lists the results that were obtained as to the number of opens for a given number of hours under test. The latter variable applies to all columns on the table except the first two which respectively indicate the temperature used in the fabrication of the lands for a particular sample or subgrouping, and the sample size.

Forward Bias Stress Test Results—150° C., ambient/85 ma, Current Density 1×10⁶ amps/cm.²

[Number of opens vs. hours on test]

| Group A, average temp., ° C.: | Size | 24 | 93 | 118 | 140 | 164 | 189 | 259 | 284 | 308 | 332 | 352 | 425 | 449 | 512 | 589 |
|---|---|---|---|---|---|---|---|---|---|---|---|---|---|---|---|---|
| 66 | 180 | 20 | 28 | 32 | 32 | 33 | 33 | 39 | 44 | 49 | 52 | 53 | 59 | 65 | 69 | 75 |
| 158 | 180 | 3 | 3 | 3 | 3 | 3 | 3 | 3 | 3 | 3 | 3 | 3 | 3 | 4 | 9 | 33 |
| 195 | 180 | 1 | 1 | 1 | 1 | 1 | 1 | 1 | 1 | 1 | 1 | 1 | 1 | 3 | 4 | 15 |
| 228 | 180 | 1 | 2 | 2 | 2 | 2 | 2 | 3 | 4 | 4 | 4 | 4 | 4 | 10 | 15 | 32 |
| 310 | 180 | 1 | 3 | 3 | 3 | 3 | 3 | 3 | 3 | 3 | 3 | 3 | 4 | 4 | 4 | 4 |

| Group B average, temp., ° C.: | Size | 46 | 116 | 145 | 191 | 305 | 355 | 400 | 475 | 496 |
|---|---|---|---|---|---|---|---|---|---|---|
| 60 | 180 | 2 | 27 | 43 | 89 | | | | | |
| 175 | 180 | 1 | 5 | 5 | 5 | 5 | 19 | 27 | 75 | 34 |
| 225 | 180 | 2 | 4 | 5 | 9 | 10 | 13 | 19 | 34 | 34 |
| 260 | 174 | 1 | 1 | 3 | 4 | 4 | 4 | 9 | 14 | 14 |
| 320 | 180 | 1 | 1 | 1 | 1 | 1 | 1 | 1 | 1 | 1 |

From the table given above, it will be appreciated that the results obtained from the forward bias stress tests are highly superior where the average, or "control wafer" temperature is of the order of 300° C., this temperature corresponding to a substrate or "production wafer," temperature of approximately 370° C. Very few "opens" resulted, even when the number of hours went above 500. In fact, in other tests not shown in the table, very few "opens" resulted even when a number of hours went as high as 1,000. It is also seen that at temperatures above 260° C., which corresponds to a substrate temperature of about 320° C. gives excellent test results. The preferred temperature range of the invention is therefore between approximately 320° and 570° C.

While there have been shown and described and pointed out the fundamental novel features of the invention as applied to the preferred embodiment, it will be understood that various omissions and substitutions and changes in the form and details of the device illustrated and in its operation may be made by those skilled in the art without departing from the spirit of the invention. It is the intention, therefore, to be limited only as indicated by the scope of the following claims.

What is claimed is:

1. In an integrated circuit manufacturing method where an insulative coating is first formed on the surface of a semiconductor substrate and openings are formed in such coating for making electrical contact to embedded regions in said substrate, the improvement which comprises;

evaporating aluminum in a vacuum so as to deposit a layer of aluminum having a thickness of at least 5,000 A. on the insulative coating at the surface of said substrate for defining selectively the lands which will serve as conductors, said deposition of said layer being performed at a substrate temperature of approximately 370° C.

2. A method as defined in claim 1, in which said semiconductor substrate is constituted of silicon.

3. A method as defined in claim 1, further including the step of forming a passivating layer of glass over said substrate.

4. A method as defined in claim 1, wherein the total thickness of the deposited aluminum is between 5,000 and 25,000 A.

* * * * *